United States Patent [19]

Ueda et al.

[11] Patent Number: 5,280,241
[45] Date of Patent: Jan. 18, 1994

[54] SUPERCONDUCTING QUANTUM INTERFERENCE DEVICE WITH THE AXES OF THE SQUID LOOP, INPUT COIL, AND MODULATION COIL ALIGNED PARALLEL WITH A PLANE OF THE SUBSTRATE

[75] Inventors: Tomoaki Ueda, Kyoto; Teruo Kido, Shiga, both of Japan

[73] Assignee: Daikin Industries, Ltd., Japan

[21] Appl. No.: 766,102

[22] Filed: Sep. 27, 1991

[30] Foreign Application Priority Data

Sep. 30, 1990 [JP] Japan .................................. 2-262019

[51] Int. Cl.⁵ .......................................... G01R 33/035
[52] U.S. Cl. .................................... 324/248; 257/31; 505/846
[58] Field of Search ................. 324/248; 307/306; 357/5; 505/702, 703, 845, 846

[56] References Cited

U.S. PATENT DOCUMENTS

| | | | |
|---|---|---|---|
| 4,403,189 | 9/1983 | Simmonds | 324/248 |
| 4,693,000 | 9/1987 | Hoenig | 324/248 X |
| 4,937,525 | 6/1990 | Daalmans | 324/248 |
| 5,142,229 | 8/1992 | Marsden | 324/248 |

OTHER PUBLICATIONS

Cromar et al, "Low-noise tunnel junction dc SQUID'S Appl. Phys. Lett.", vol. 38(9), May 1981, pp. 723-725.

*Primary Examiner*—Gerard R. Strecker
*Attorney, Agent, or Firm*—Beveridge, DeGrandi, Weilacher

[57] ABSTRACT

A superconducting quantum interference device loop, a modulation coil and an input coil are formed in parallel and their axes being parallel to a substrate, on the substrate. At least one tap is formed at a predetermined position on the input coil. In a preferred embodiment, a superconductive shield is formed on the substrate in one body. The superconductive shield surrounds the superconducting quantum interference device loop, the modulation coil and the input coil.

4 Claims, 8 Drawing Sheets

Fig. 8 (A) (PRIOR ART)
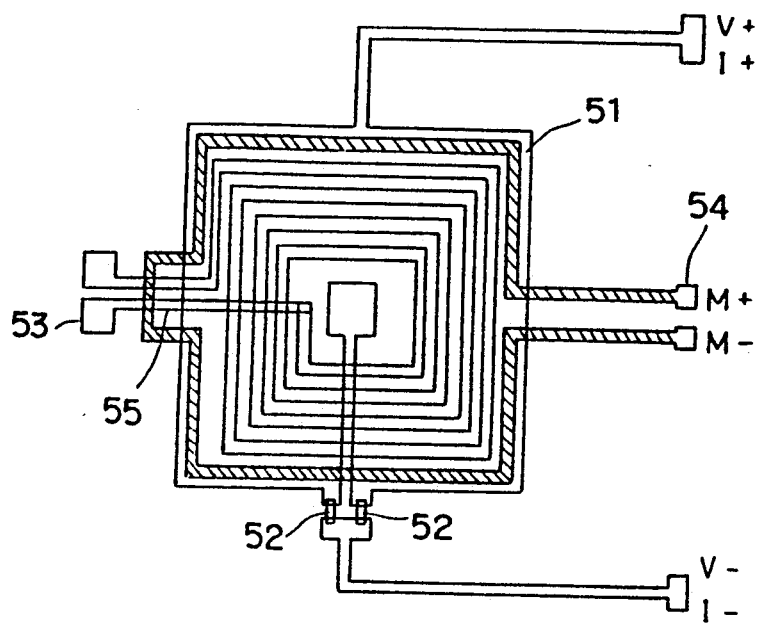
Fig. 8 (B) (PRIOR ART)
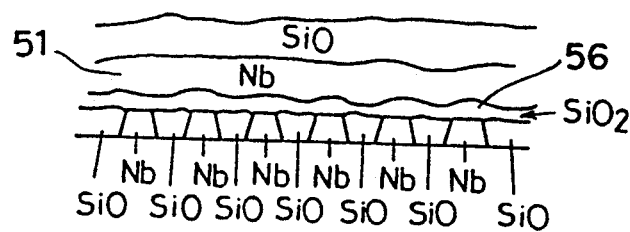

SUPERCONDUCTING QUANTUM INTERFERENCE DEVICE WITH THE AXES OF THE SQUID LOOP, INPUT COIL, AND MODULATION COIL ALIGNED PARALLEL WITH A PLANE OF THE SUBSTRATE

BACKGROUND OF THE INVENTION

The present invention relates to a superconducting quantum interference device (hereinafter referred to as a SQUID). More particularly, the present invention relates to a SQUID which includes a superconductive loop, one or two Josephson junctions (hereinafter referred to as JJs) formed at predetermined positions on the superconductive loop, an input coil for efficiently guiding magnetic flux to the superconductive loop on which one or two JJs are formed (hereinafter referred to as SQUID loop), and a modulation coil for supplying magnetic flux to the superconductive loop for compensating for variations in the external magnetic flux, as a principle arrangement, and which SQUID is integrated in its entirety on a substrate.

It is known that a SQUID is capable of detecting magnetic flux with extremely high sensitivity. With attention to this characteristic, a SQUID is applied to various apparatus which are used in various technical fields. A SQUID is classified as an rf-SQUID if it has only one JJ and as a dc-SQUID if it has two JJs. The rf-SQUID was generally used in the past years, while the dc-SQUID is being widely used in recent years because two JJs having similar characteristics can be obtained due to improvements in thin film manufacturing engineering in recent years.

FIG. 7 is an electrical diagram for explaining the principle of a dc-SQUID magnetic flux meter.

The dc-SQUID includes a superconductive loop 51 and two JJs 52 which are provided at predetermined positions on the superconductive loop 51. A bias current is supplied to the opposite positions on the superconductive loop 51 with respect to the JJs 52. An input coil 53, which is interconnected with a pickup coil (not shown) for detecting the magnetic flux of an object under measurement, is provided at a closed position on the superconductive loop 51. A modulation coil 54 which is used for performing magnetic flux locked loop operation, is further provided.

FIG. 8(A) is a plan view showing an arrangement of a conventional SQUID, while FIG. 8(B) is a cross sectional view thereof.

An input coil 53, a superconductive loop 51, a modulation coil 54 and JJs 52 are formed in a lamination layer manner. The SQUID also includes wirings 55 and layer insulation layers 56.

When the SQUID having the arrangement above-mentioned is employed, the input coil 53 can be positioned at a closed position with respect to the superconductive loop 51 so as to improve magnetic flux guiding efficiency to the superconductive loop 51 by the input coil 53.

The SQUID having the arrangement above-mentioned is designed whereby its input coil has minimum line width so as to decrease the outside dimension of a chip. The input coil of the SQUID is formed below a SQUID loop which includes the superconductive loop and the JJs. With this SQUID it is almost impossible to form taps, accordingly. The SQUID is required to have an inductance L of the input coil which has a spiral shape, set to an optimum value in correspondence with the design of an externally attached pickup coil for which environmental conditions should be taken into consideration, so as to increase the magnetic flux guiding efficiency to a maximum value. SQUIDs having corresponding input coils with different numbers of turns are accordingly manufactured in correspondence with pickup coils.

A disadvantage arises in that manhours for designing and for manufacturing increase due to the necessity of preparing mask patterns corresponding to the numbers of turns of input coils. Disadvantages also arise in that the cost of the SQUID is increased, manufacturing efficiency is lowered, reliability of the SQUID is lowered and so on, due to the sizes of chips being different from one another in correspondence with the numbers of turns of corresponding input coils, and the necessity of preparing packages in correspondence with the chips having different sizes.

A SQUID is easily influenced by electromagnetic noises, therefore the SQUID is housed in a superconductive shield using a niobium tube so as to improve magnetic field measurement accuracy when a feeble magnetic field such as the magnetic field of a living organism is to be measured. The superconductive shield using a niobium tube has great heat capacity. Disadvantages arise in that liquid helium loss becomes great when a refrigerating system using liquid helium is employed, and in that it requires a long time period for cooling down a SQUID when the refrigerating system using a refrigerator is employed. It is proposed that a SQUID having a spectacle type arrangement be employed so as to cancel the influence of external magnetic fields and to omit a superconductive shield, by taking the disadvantage above-mentioned into consideration. A disadvantage arises in that trapping of magnetic flux easily occurs because a SQUID is exposed to external magnetic flux when the SQUID is cooled down.

A SQUID needs layer insulation layers when each layer is formed in a lamination manner. The SQUID should be prevented from having its characteristics lowered when each layer insulation layer is formed. Thereby, a film forming process with high temperature cannot be employed. Disadvantages arise in that good layer insulation layers cannot be obtained, in that fine processing is difficult to perform because good flattening of the SQUID cannot be performed when the number of layers increases, and in that the yield of SQUIDs is lowered because disconnection and the like occurs when fine processing is forcibly employed.

SUMMARY OF THE INVENTION

It is an object of the present invention to improve the yield of SQUIDs.

It is another object of the present invention to perform varying of an inductance of a SQUID without varying the size of the chip.

It is a further object of the present invention to decrease the refrigerating ability necessary for cooling down a SQUID to below a superconductive temperature.

To perform the objects above-mentioned, a SQUID comprises;

a substrate, a SQUID loop formed on the substrate, a modulation coil formed on the substrate, and an input coil formed on the substrate, wherein the SQUID loop, the modulation coil and the input coil are disposed so that their axes are parallel to the substrate.

When this SQUID is employed, the SQUID superconductive loop, the modulation coil and the input coil are not laminated. Insulations therebetween are easily formed in comparison with the conventional SQUID which needs laminated layers and layer insulation layers. Flattening of the SQUID is accordingly not necessary, thereby the yield of SQUIDs is improved. Clearances therebetween similar to that of layers in a conventional SQUID can be obtained by applying a semiconductor manufacturing process patterning technique, thereby a SQUID having good characteristics is obtained.

Taps can easily be formed at predetermined positions corresponding to a required number of turns when the input coil is formed so that its axis is parallel to the substrate. Thus, according to the present invention, the input coil has a required number of turns and its axis is parallel to the substrate instead of being a spiral shaped input coil formed on the substrate.

When a relatively large substrate is employed, plural SQUIDs can be formed at every predetermined distance.

It is preferable that wirings with respect to the SQUID loop are arranged in parallel to the axis thereof and arranged in parallel to the substrate.

When this SQUID is employed, magnetic fields generated by a current flowing in the wirings are securely prevented from interferring with the SQUID formed on the substrate, thereby the SQUID is improved.

It is also preferable that at least one tap is formed at a predetermined position on the input coil.

When this SQUID is employed, the input coil is easily varied as to its number of turns by selecting a tap. An optimum number of turns can be easily selected corresponding to the inductance of a pickup coil externally provided. A disadvantage is overcome in that now different SQUIDs are not required to obtain different numbers of turns in their pickup coils.

It is further preferable that a superconductive shield is provided on the substrate in one body, the superconductive shield surrounding the SQUID loop, the modulation coil and the input coil.

When this SQUID is employed, the SQUID should not be housed in a superconductive shield using a niobium tube, thereby the refrigerating capacity necessary for cooling down the SQUID can be decreased. Interferences between plural SQUIDs are securely prevented from occurring when plural SQUIDs are formed on the substrate.

These and other objectives, features and advantages of the present invention will be more readily understood upon consideration of the present invention, in conjunction with the accompanying drawings.

BRIEF DESCRIPTION OF THE DRAWINGS

FIG. 8(A) is a plan view of a conventional SQUID; and

FIG. 8(B) is a cross-sectional view of the conventional SQUID of FIG. 8(A).

DETAILED DESCRIPTION OF THE PREFERRED EMBODIMENTS

Figure 1:
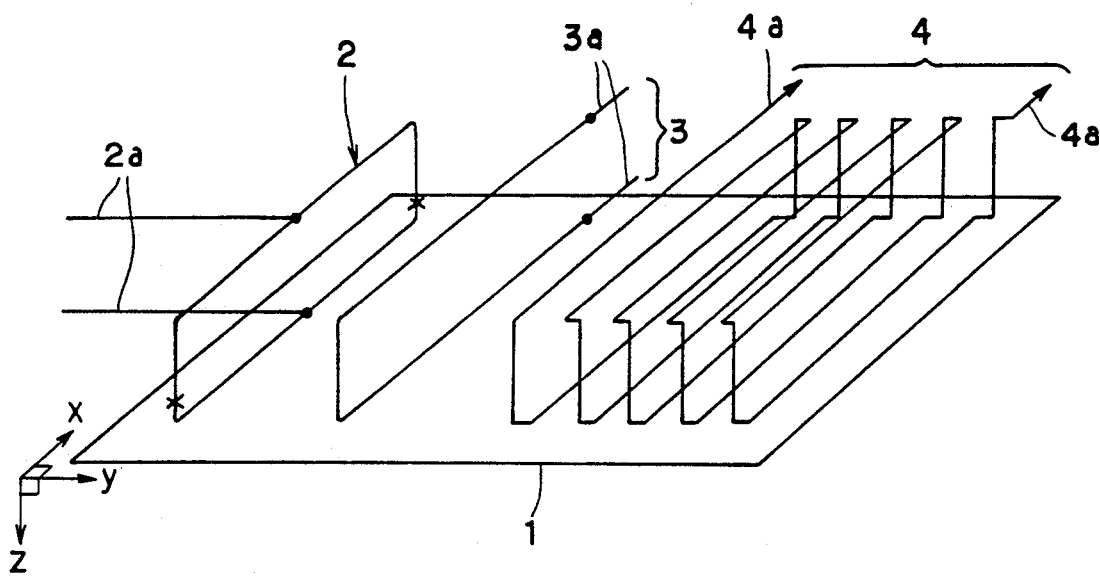
FIG. 1 is a perspective view of a SQUID according to an embodiment of the present invention.

FIG. 1 is a perspective view of a SQUID according to an embodiment of the present invention.

A SQUID comprises a substrate 1, a SQUID superconductive loop 2 having Josephson junctions, which loop is positioned within a plane at right angles to the substrate 1, a modulation coil 3 which is parallel to the SQUID loop 2 and an input coil 4 which includes plural loops interconnected in serial, each loop being essentially parallel to the SQUID loop 2 and the modulation coil 3. Distances between the SQUID loop 2 and the modulation coil 3, and modulation coil 3 and the input coil 4 are determined so as to guide magnetic flux generated by the modulation coil 3 and the input coil 4 to the SQUID loop 2. Wirings 2a with respect to the SQUID loop 2 lead out in a direction which is at right angles to a plane which includes the SQUID loop 2 and is parallel to the substrate 1. Wirings 3a with respect to the modulation coil 3 and wirings 4a with respect to the input coil 4 lead out in a direction which is at right angles to the axis of the modulation coil 3 and the axis of the input coil 4 and is parallel to the substrate 1. Thereby, the SQUID is prevented from being influenced by magnetic fields due to currents which flow in corresponding wirings.

FIGS. 2(A) through 2(D) are cross-sectional views explaining a manufacturing process for the SQUID having the construction shown in FIG. 1. FIGS. 2(A) through 2(D) show only portions for manufacturing the SQUID loop.

Figure 2:
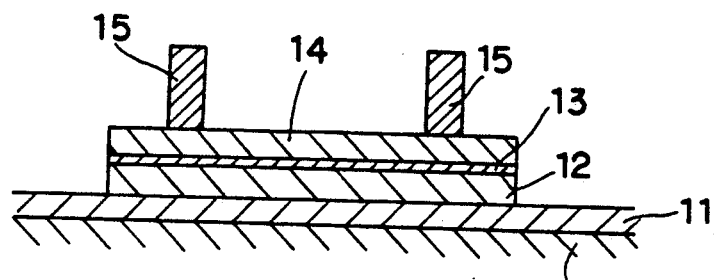
FIGS. 2(A), 2(B), 2(C) and 2(D) are cross sectional views useful in explaining the manufacturing process for the SQUID having the construction shown in FIG. 1.
Figure 2:
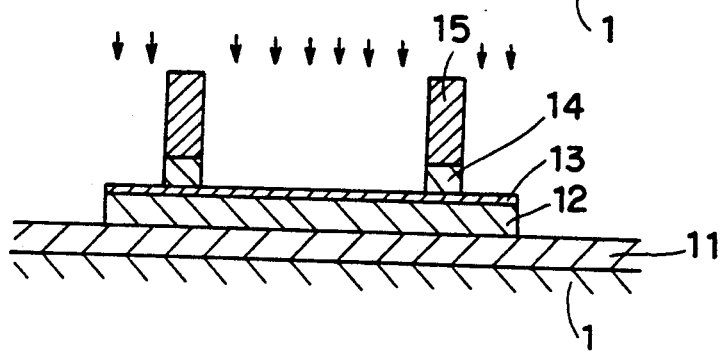
Figure 2:
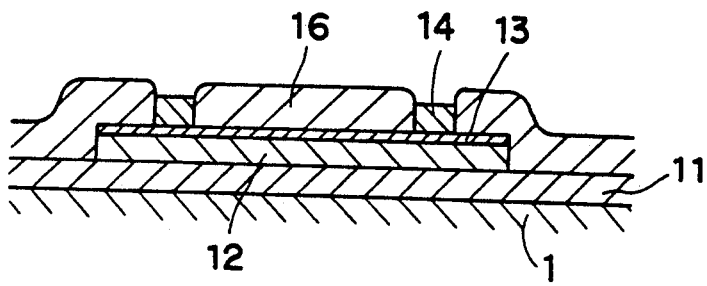
Figure 2:
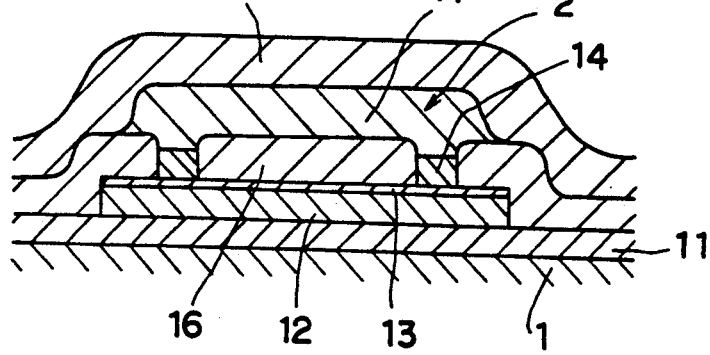

A MgO layer 11 as an etching stopper having a thickness of 20-30 nanometers is formed on a Si substrate 1 by an electron beam deposition method and the like, then a Nb layer 12 having a thickness of 0.2-0.3 micrometers, an Al layer 13 having a thickness of 30 angstroms and an Nb layer 14 having a thickness of 0.3 micrometers are formed on the MgO layer 11 in this order by a sputtering method and the like (refer to FIG. 2(A)). Photo resist layer 15 having predetermined shape and thickness is formed at edge portions on the Nb layer 14 (also refer to FIG. 2(A)). Thereafter, the central portion of the Nb layer 14 is removed by a reactive ion etching method (hereinafter referred to as RIE) using CF4 gas at 200 milli Torrs to generate plasma by a micro wave having its electric power at 100 watts (refer to FIG. 2(B)). A SiO layer 16 having a thickness of 0.5 micrometers is formed by an electron beam deposition method and the like on the removed portion of the Nb layer 14, then the photo resist layer 15 is removed (refer to FIG. 2(C)). Thereafter, a Pb/In layer 17 having a thickness of 1 micrometer is formed so as to cover the remaining portions of the Nb layer 14 and the SiO layer 16, then a SiO layer 18 having a thickness of 1 micrometer is formed so as to cover the Pb/In layer 17 (refer to FIG. 2(D)).

Figure 3:
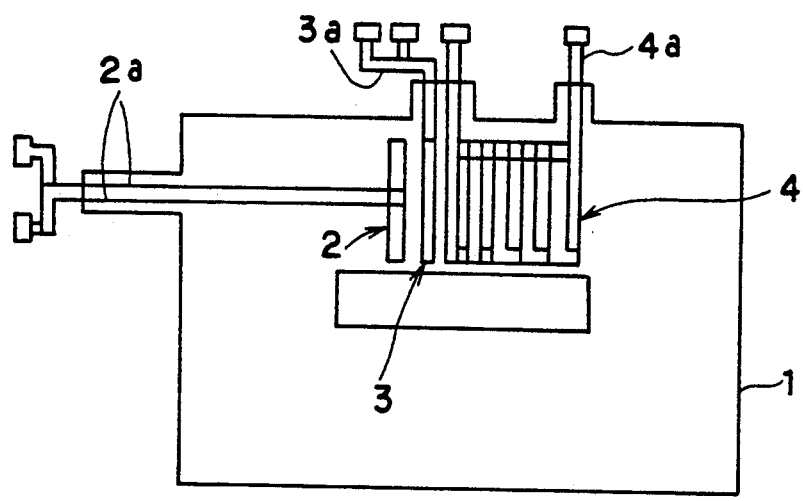
FIG. 3 is plan view of a SQUID including wirings with respect to the SQUID.

The SQUID loop 2 including the Nb layer 12, Al layer 13, Nb layer 14 and Pb/In layer 17 is formed on the substrate 1 by employing the series of processings above-mentioned. The Josephson junctions are formed by layers 12, 13 and 14. The wirings 2a with respect to the SQUID loop 2 can easily be formed in one body by lengthening the Nb layer 12 and the Pb/In layer 17 in a direction which is at right angles to the SQUID loop 2, is parallel to the substrate 1 and is an opposite direction to the modulation coil 3 with respect to the SQUID loop 2 (refer to FIG. 3), for example.

The modulation coil 3 and the input coil 4 are not required to be JJs which have the construction that the Al layer 13 is formed between the Nb layers 12 and 14, the modulation coil 3 and the input coil 4 are sufficiently formed in their entirety by a Pb/In layer, for example.

When the SQUID having the construction above-mentioned is employed, a flattening operation is not required because the SQUID loop 2 and the input coil 4 are not laminated to one another, thereby the yield of SQUIDs is improved. Wirings 2a lead out in a direction which are parallel to the axis of the SQUID loop 2, thereby the disadvantage that the SQUID is influenced by magnetic fields generated by currents flowing in the wirings 2a is overcome.

SECOND EMBODIMENT

Figure 4:
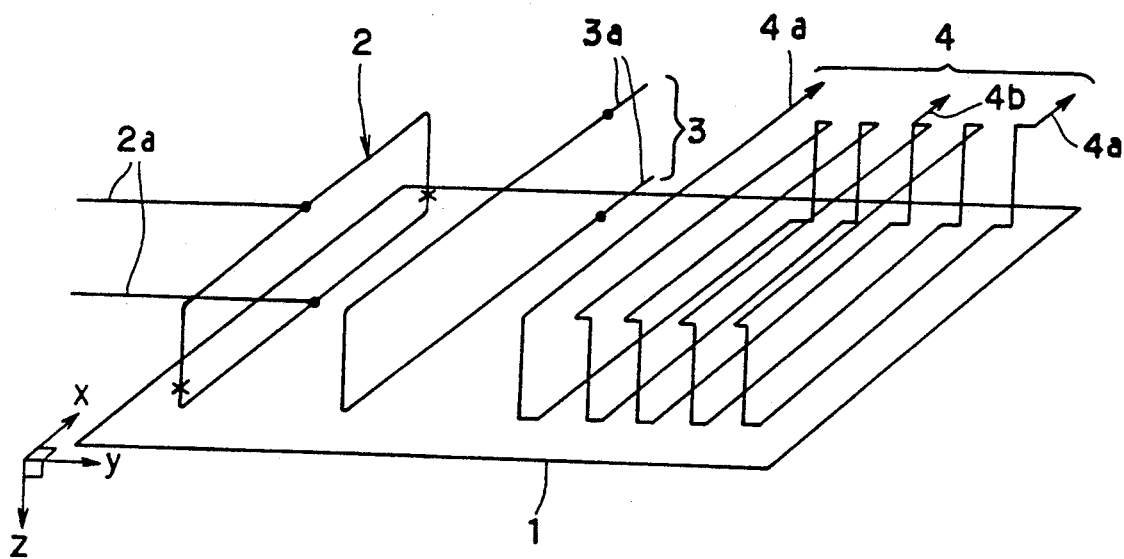
FIG. 4 is a perspective view of a SQUID according to another embodiment of the present invention.

FIG. 4 is a perspective view of a SQUID according to another embodiment of the present invention.

The SQUID of FIG. 4 differs from the SQUID shown in FIG. 1 in that a tap 4b is formed at a predetermined position along the input coil 4.

The input coil 4 is formed on the Si substrate 1 and the axis of the input coil 4 is parallel to the Si substrate 1. Thereby, the tap 4b is easily formed at the predetermined position on the input coil 4, which easy formation of the tap greatly differs from a conventional SQUID having a spiral shaped input coil formed on the substrate. FIG. 4 shows only one tap 4b, but plural taps can be formed when it is required.

When the SQUID having the construction above-mentioned is employed, transmission efficiency between the pickup coil and the input coil is improved to a maximum value by selecting one of the taps so as to match the inductances of the input coil and the pickup coil, the pickup coil being designed by taking environmental conditions into consideration. As a result, plural kinds of SQUIDS having corresponding input coils of which the numbers of turns are different from one another, are not required to be previously manufactured, thereby the sizes of chips each of which include a SQUID can be the same.

THIRD EMBODIMENT

Figure 5:
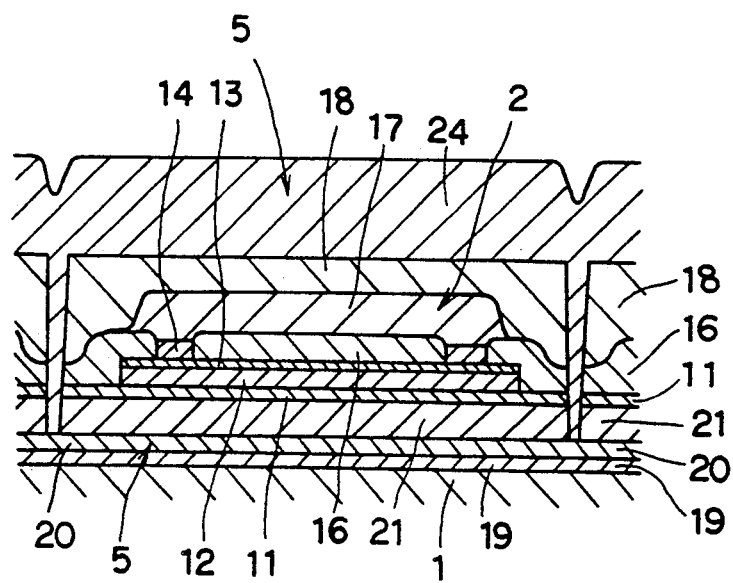
FIG. 5 is a cross sectional view of a SQUID according to a further embodiment of the present invention.

FIG. 5 is a cross sectional view of a SQUID according to a further embodiment of the present invention.

The SQUID shown in FIG. 5 is different from the SQUID having the construction shown in FIG. 4 in that a superconductive shield 5 is formed on the Si substrate 1 in one body for surrounding the SQUID loop 2, modulation coil 3 and the input coil 4.

FIGS. 6(A) through 6(G) are cross-sectional views explaining a manufacturing process for the SQUID having the construction shown in FIG. 5. FIGS. 6(A) through 6(G) show only portions for manufacturing the SQUID loop.

Figure 6:
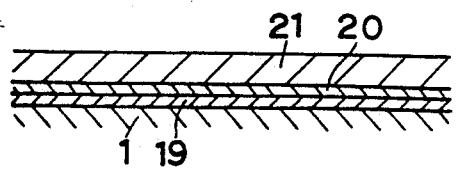
FIGS. 6(A) to 6(G) are cross-sectional views useful in explaining the manufacturing process for a SQUID having the construction shown in FIG. 5.
Figure 6:
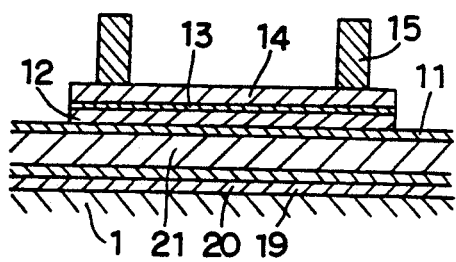
Figure 6:
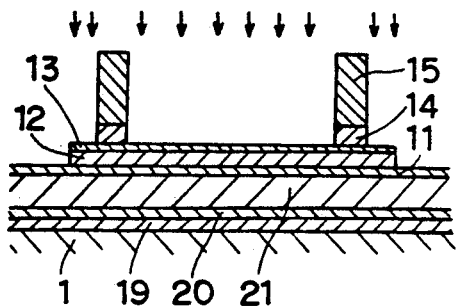
Figure 6:
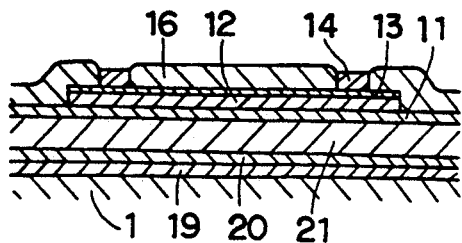
Figure 6:
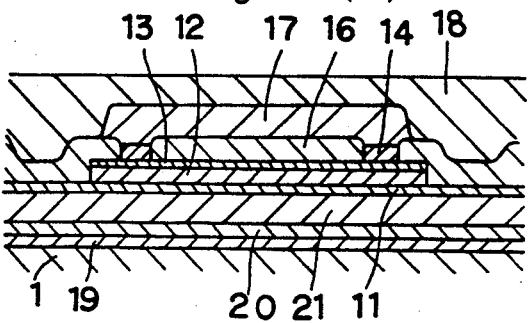
Figure 6:
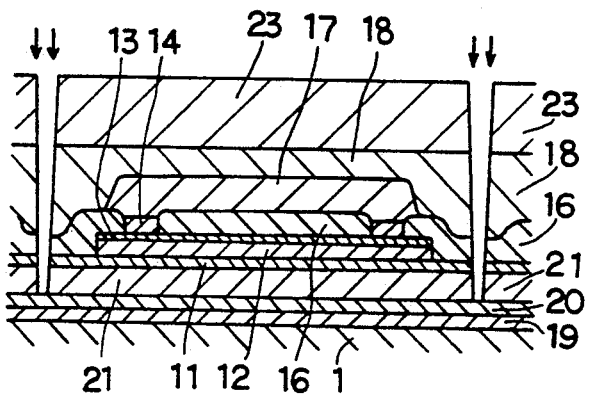
Figure 6:
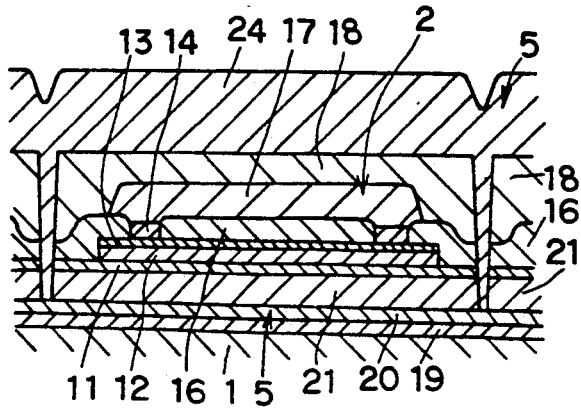
Figure 7:
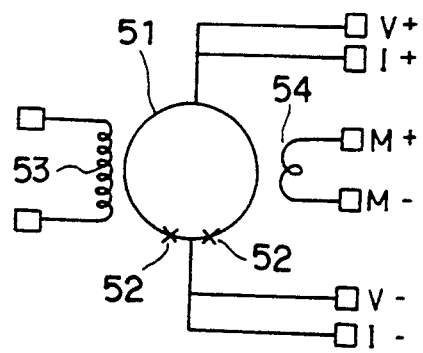
FIG. 7 is an electronic diagram for showing the principle of a dc-SQUID magnetic flux meter.

A MgO layer 19 having a thickness of 20-30 nanometers is formed on a Si substrate 1, then a Nb layer 20 having a thickness of 0.2-0.3 micrometers and a SiO layer 21 having a thickness of 0.5 micrometers are formed on the MgO layer 19 in this order (refer to FIG. 6(A)). Thereafter, a SQUID loop 2 is formed as is shown in FIGS. 6(B)-6(E). The Josephson junctions likewise are formed by layers 12, 13, and 14. The manufacturing processes in FIGS. 6(B)-6(E) are similar to the manufacturing processes in FIGS. 2(A)-2(D), thereby the corresponding description is omitted.

Photo resist layer 23 is formed on the SiO layer 18, then the SiO layers 16 and 18 are partially removed by an RIE using CF4 gas at 20 milli Torrs to generate plasma by a micro wave having electric power of 100 watts. The MgO layer 11 is partially chemically removed using phosphoric acid aqueous solution, then the SiO layer 21 is partially removed by an RIE using CF4 gas at 20 milli Torrs to generate plasma by a micro wave having electric power of 100 watts, so as to expose the Nb layer 20 in the corresponding portions (refer to FIG. 6(F)). After that, photo resist layer 23 is removed, then a Pb/In layer 24 is formed in the removed portion of the SiO layers 16, 18 and 21 and on the SiO layer 18 (refer to FIG. 6(G)).

As is apparent from the foregoing, the SQUID loop 2 is surrounded by a superconductive shield 5 comprising the Nb layer 20 and the Pb/In layer 24. The heat capacity of the superconductive shield 5 is small because layers of the superconductive shield 5 have an extremely small thickness, thereby the refrigerating power required for cooling down the SQUID can be decreased.

Plural SQUIDs can be formed on one substrate with preventing interferences between SQUIDs from occurring because each SQUID formed on the substrate is surrounded by the superconductive shield.

The SQUIDs according to the present invention are not limited to the embodiments mentioned above. The SQUID may employ oxide superconductive material. The SQUID may determine the number of turns of the input coil by employing a bonding option.

The terms and expressions which have been employed are used as terms of description and not of limitation, and there is no intention, in the use of such terms and expressions, to exclude equivalents of the features shown and described, or portions thereof, it being recognized that various modifications are possible within the scope of the invention as claimed.

What is claimed is:

1. A superconducting quantum interference device comprising:

a substrate which defines a plane, a SQUID superconducting loop formed integrally on said substrate, a modulation coil formed integrally on said substrate and being adapted for providing magnetic flux to said superconducting loop for compensating for variations in external magnetic flux applied to said loop, and an input coil formed integrally on said substrate and being adapted to apply external magnetic flux to said superconducting loop, said SQUID loop, said modulation coil and said input coil having axes therethrough and being disposed so that their axes are parallel to said plane of said substrate.

2. A superconducting quantum interference device as set forth in claim 1, further comprising wiring means connected to said SQUID superconducting loop, said wiring means being arranged in parallel to said axis of said superconducting loop and arranged in parallel to said plane of said substrate.

3. A superconducting quantum interference device as set forth in claim 1, further comprising at least one tap which is formed at a predetermined position on said input coil.

4. A superconducting quantum interference device as set forth in claim 1, further comprising a superconductive shield which is provided on said substrate in one body, said superconductive shield surrounding said SQUID loop, said modulation coil and said input coil.

* * * * *